United States Patent
Horikawa

(10) Patent No.: US 10,719,643 B2
(45) Date of Patent: Jul. 21, 2020

(54) LADDER PROGRAM EDITING SUPPORT APPARATUS AND LADDER PROGRAM EDITING METHOD

(71) Applicant: Mitsubishi Electric Corporation, Tokyo (JP)

(72) Inventor: Tomo Horikawa, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 65 days.

(21) Appl. No.: 16/316,391

(22) PCT Filed: Sep. 14, 2016

(86) PCT No.: PCT/JP2016/077177
§ 371 (c)(1),
(2) Date: Jan. 9, 2019

(87) PCT Pub. No.: WO2018/051441
PCT Pub. Date: Mar. 22, 2018

(65) Prior Publication Data
US 2019/0236233 A1    Aug. 1, 2019

(51) Int. Cl.
*G06F 17/50* (2006.01)
*G06F 9/451* (2018.01)
(Continued)

(52) U.S. Cl.
CPC ............ *G06F 30/30* (2020.01); *G05B 19/05* (2013.01); *G06F 9/451* (2018.02); *G05B 19/056* (2013.01);
(Continued)

(58) Field of Classification Search
None
See application file for complete search history.

(56) References Cited

U.S. PATENT DOCUMENTS 4,038,533 A * 7/1977 Dummermuth .... G05B 19/4147
700/7
5,586,335 A * 12/1996 Utan .................... G05B 19/056
700/18
(Continued)

FOREIGN PATENT DOCUMENTS

JP     05-189012 A      7/1993
JP     2000-163109 A    6/2000
(Continued)

OTHER PUBLICATIONS

International Search Report dated Dec. 6, 2016 for PCT/JP2016/077177 filed on Sep. 14, 2016, 7 pages including English translation.

*Primary Examiner* — Ramesh B Patel
(74) *Attorney, Agent, or Firm* — Xsensus LLP

(57) ABSTRACT

A ladder program editing support apparatus edits a ladder program by causing a display to display a plurality of circuit elements that is each displayed as a symbol in an area between a plus bus line and a minus bus line in the ladder program and makes up the ladder program. The ladder program editing support apparatus includes the display that displays the ladder program, and an edit control unit that selects a selected range to be edited within the ladder program displayed on the display and displays identification information on the circuit elements included in the ladder program within the selected range on the display in the form of a list according to a preset displaying order.

28 Claims, 13 Drawing Sheets

(51) Int. Cl.
  *G06F 30/30* (2020.01)
  *G05B 19/05* (2006.01)
  *G05B 19/10* (2006.01)

(52) U.S. Cl.
  CPC .......... *G05B 19/102* (2013.01); *G05B 19/104* (2013.01); *G05B 19/106* (2013.01)

(56) References Cited

U.S. PATENT DOCUMENTS

| | | | | |
|---|---|---|---|---|
| 5,590,253 A * | 12/1996 | Onishi | .................. | G06T 11/206 345/619 |
| 5,781,776 A * | 7/1998 | Johnston | .............. | G05B 19/056 717/130 |
| 5,818,711 A * | 10/1998 | Schwabe | .............. | G05B 19/056 700/18 |
| 5,949,674 A * | 9/1999 | Song | .................. | G05B 19/4183 700/2 |
| 6,505,341 B1 * | 1/2003 | Harris | .................... | G05B 11/42 716/117 |
| 6,952,811 B1 * | 10/2005 | Iwata | .................. | G05B 19/056 345/168 |
| 7,110,837 B2 * | 9/2006 | Oka | ..................... | G05B 19/056 700/18 |
| 7,603,183 B1 * | 10/2009 | Munemoto | ............ | G05B 19/05 700/17 |
| 7,721,255 B2 * | 5/2010 | Maeda | ................. | G05B 19/056 700/18 |
| 8,296,733 B2 * | 10/2012 | Phillips | ..................... | G06F 8/71 717/122 |
| 9,176,734 B2 * | 11/2015 | Tomita | ................. | G05B 19/056 |
| 9,910,643 B2 * | 3/2018 | Udou | ................. | G05B 19/0426 |
| 2009/0083705 A1 * | 3/2009 | Phillips | ..................... | G06F 8/71 717/113 |
| 2011/0295388 A1 * | 12/2011 | Iwata | ................... | G05B 19/056 700/18 |
| 2013/0241586 A1 * | 9/2013 | Horikawa | .......... | G05B 23/0267 324/750.3 |
| 2016/0004242 A1 * | 1/2016 | Yamaoka | ............. | G05B 19/056 700/87 |
| 2016/0378866 A1 * | 12/2016 | Matsuo | .................. | H04L 67/02 707/722 |

FOREIGN PATENT DOCUMENTS

| | | |
|---|---|---|
| JP | 2000-194406 A | 7/2000 |
| JP | 2006-202165 A | 8/2006 |
| JP | 2012-079132 A | 4/2012 |
| JP | 5777838 B2 | 9/2015 |

* cited by examiner

PROGRAM COMPONENT NAME: COMPONENT A

| COORDI-NATE POSITION | PROPERTY INFORMATION ||| CIRCUIT ELEMENT COMMENT | CURRENT VALUE |
|---|---|---|---|---|---|
| | CIRCUIT ELEMENT TYPE | CIRCUIT ELEMENT IDENTIFIER | INSTRUC-TION TYPE | | |
| (0,0) | INPUT | X0 | LD | OPERATION START BUTTON A | ON |
| (1,0) | INPUT | X1 | LD | OPERATION START BUTTON B | ON |
| (0,1) | INPUT | X2 | LDI | EMERGENCY STOP BUTTON | OFF |

SECURITY INFORMATION (R/W)

FIG.21

DISPLAY UNAVAILABLE
BECAUSE READ IS DISABLED

24

DISPLAY UNAVAILABLE
BECAUSE READ IS DISABLED

| COMPONENT A | | | | | | | |
|---|---|---|---|---|---|---|---|
| CIRCUIT ELEMENT IDENTIFIER | CURRENT VALUE | CIRCUIT ELEMENT COMMENT | INSTRUCTION TYPE | CIRCUIT ELEMENT IDENTIFIER | CURRENT VALUE | CIRCUIT ELEMENT COMMENT | INSTRUCTION TYPE |
| X0 | ON | OPERATION START BUTTON A | LD | X1 | ON | OPERATION START BUTTON B | LD |
| X2 | OFF | EMERGENCY STOP BUTTON | LD1 | | | | |

23

FIG.23
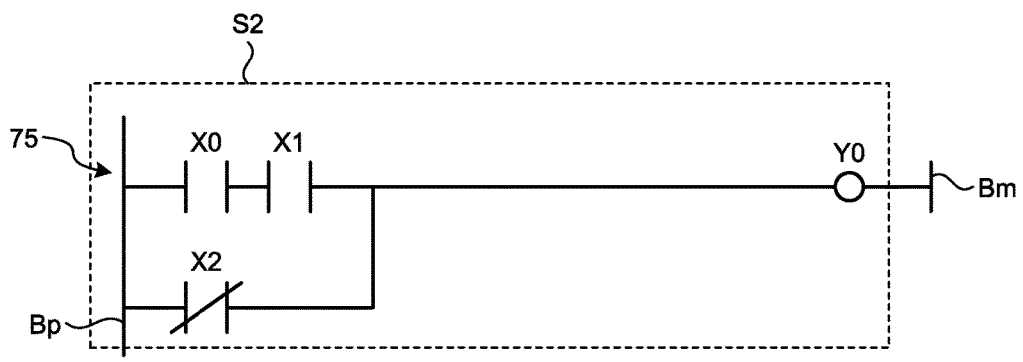
FIG.24
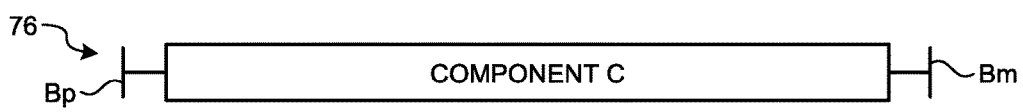
FIG.25
| COMPONENT C | | | | | | | |
|---|---|---|---|---|---|---|---|
| CIRCUIT ELEMENT IDENTIFIER | CURRENT VALUE | CIRCUIT ELEMENT COMMENT | INSTRUCTION TYPE | CIRCUIT ELEMENT IDENTIFIER | CURRENT VALUE | CIRCUIT ELEMENT COMMENT | INSTRUCTION TYPE |
| X0 | ON | OPERATION START BUTTON A | LD | Y0 | OFF | IN-OPERATION LAMP | OUT |
| X1 | ON | OPERATION START BUTTON B | LD | | | | |
| X2 | OFF | EMERGENCY STOP BUTTON | LD1 | | | | |

US 10,719,643 B2

LADDER PROGRAM EDITING SUPPORT APPARATUS AND LADDER PROGRAM EDITING METHOD

CROSS-REFERENCE TO RELATED APPLICATION

This application is a National Stage Application based on PCT/JP2016/077177, filed on 14 Sep. 2016, the entire contents of which being incorporated herein by reference.

FIELD

The present invention relates to a ladder program editing support apparatus used for editing a ladder program and a ladder program editing method.

BACKGROUND

In general, an industrial controller called programmable logic controller (PLC) is used to control various kinds of facilities. A ladder language is a typical programming language used for a control program executed by the industrial controller. A program written in the ladder language is typically created using a program editing support apparatus. Such a program written in the ladder language will be hereinafter referred to as a ladder program.

A controlled object device connected to the PLC is in many cases realized by using an existing device or by using an expanded form of an existing device. For this reason, it is often the case that a ladder program partially having a difference from an existing ladder program is created although its major part is the same as the existing ladder program. Therefore, when a program is created, a part of an existing ladder program is often componentized in functional units to be reused.

Componentization and reuse of the ladder program are typically achieved using the system of function blocks defined in the International Electrotechnical Commission (IEC) 61131 standard. The function blocks enable encapsulation of information forming the ladder program and thus make it possible to reuse the ladder program as a component or components.

However, the function block describes, as a variable, a symbol corresponding to an input/output device making up a program subjected to componentization. The program is then reused by linking an input/output device actually used to the variable. For this reason, some input means for linking the variable to the input/output device is required at a point of insertion of the function block, and so it is necessary to provide input points as many as the number of input/output devices in the program subjected to componentization.

Typically, in a case where the point of insertion of the function block is represented as one box, inputs on the left side of the box and outputs on the right side of the box are arranged in the vertical direction as many as the number of input/output devices. In the case of many input/output devices, the box at an insertion point grows vertically, thereby reducing readability of the program and making it difficult to link the variables to the input/output devices to thus cause reduction in work efficiency and efficiency of editing the ladder program.

As a technique using such function blocks, Patent Literature 1 proposes a method of expressing a program in a function block as a truth table to facilitate modifications and alterations of the program.

CITATION LIST

Patent Literature

Patent Literature 1: Japanese Patent Application Laid-open No. 2000-194406

SUMMARY

Technical Problem

However, Patent Literature 1 mentioned above discloses a technique for facilitating modifications of the program in a function block with a created function block being targeted, but does not describe a technique that can solve the problem with the efficiency of editing the ladder program caused by the structure of the function block as described above, thereby failing to solve the above problem.

The present invention has been made in view of the above circumstances, and an object of the present invention is to provide a ladder program editing support apparatus that can improve the efficiency of editing a ladder program.

Solution to Problem

In order to solve the above-mentioned problems and achieve the object, the present invention provides a ladder program editing support apparatus for editing a ladder program by causing a display to display a plurality of circuit elements that is each displayed as a symbol in an area between a plus bus line and a minus bus line in the ladder program and makes up the ladder program. The ladder program editing support apparatus comprises: the display to display the ladder program; and an edit control unit to select a selected range to be edited within the ladder program displayed on the display, and display identification information on the circuit elements included in the ladder program within the selected range on the display in the form of a list according to a preset displaying order of display.

Advantageous Effects of Invention

The ladder program editing support apparatus according to the present invention can improve the efficiency of editing the ladder program, thereby leading to an advantageous effect.

BRIEF DESCRIPTION OF DRAWINGS

FIG. 21 is a diagram illustrating an example of screen display of the circuit element edit region and the pre-componentized program display region in a state in which reading of information on a program component is disabled according to security information in the embodiment of the present invention.

FIG. 22 is a diagram illustrating an example of a state in which information on circuit elements in a program component selected in the embodiment of the present invention is displayed in the form of a list in another display pattern in the circuit element edit region.

FIG. 23 is a diagram illustrating a ladder program in a state before componentization of a selected range is performed in the embodiment of the present invention.

FIG. 24 is a diagram illustrating a ladder program in a state in which componentization of a selected range is completed in the embodiment of the present invention.

FIG. 25 is a diagram illustrating an example of a state in which information on circuit elements in a program component selected in the embodiment of the present invention is displayed in the form of a list in another display pattern in the circuit element edit region.

DESCRIPTION OF EMBODIMENT

Hereinafter, a ladder program editing support apparatus and a ladder program editing method according to an embodiment of the present invention will be described in detail with reference to the drawings. Note that the present invention is not necessarily limited by the embodiment.

Embodiment

Figure 1:
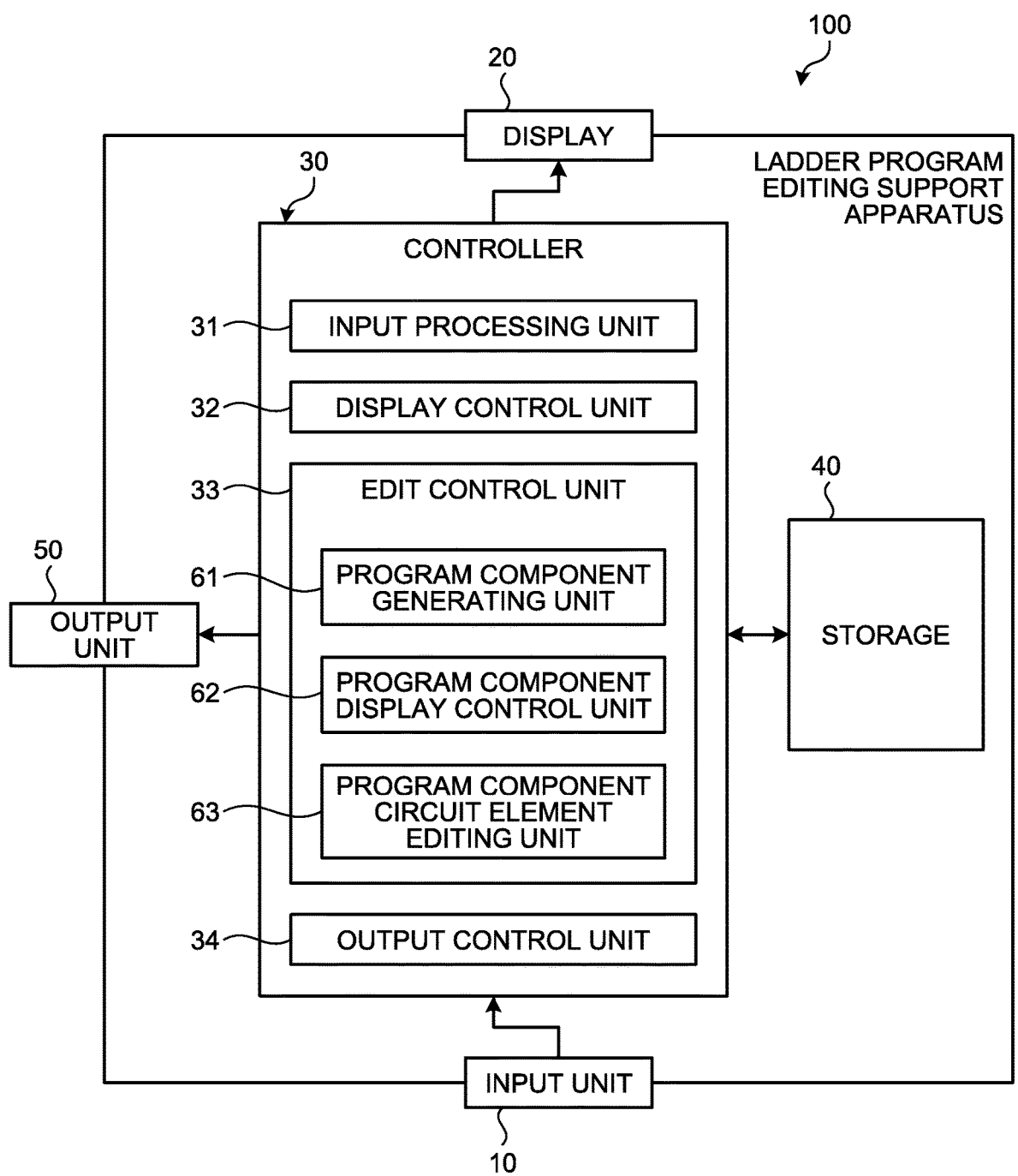
FIG. 1 is a block diagram illustrating the configuration of a ladder program editing support apparatus according to an embodiment of the present invention.

FIG. 1 is a block diagram illustrating the configuration of a ladder program editing support apparatus 100 according to an embodiment of the present invention. The ladder program editing support apparatus 100 is a device that supports creation of a ladder program to be used when a PLC controls a controlled object device in a PLC system. The ladder program editing support apparatus 100 includes an input unit 10, a display 20, a controller 30, a storage 40, and an output unit 50. These components are connected with one another to be able to communicate information among them. The ladder program editing support apparatus 100 displays a predetermined circuit element symbolically on a screen of the display 20 on the basis of a command inputted from the input unit 10, so as to edit and create a ladder program in which at least one input condition is associated with one output condition.

The ladder program uses a circuit element to perform setting for each element used for control in the controlled object device connected to the PLC. The circuit element is a basic component of the ladder program, the component corresponding to an element to be treated as an integral part such as a contact or a coil. The circuit element is graphical and symbolically displayed using a visual object in the ladder program. In the PLC, input/output data exchanged with the controlled object device connected to the PLC is stored in a predetermined memory area of the PLC. Thus, a corresponding memory address is determined for each element. Each circuit element is identified by a circuit element identifier that is identification information indicated by a circuit element character and a number representing the address. The circuit element character is determined by a data type. For example, input is expressed as "X", and output is expressed as "Y". Accordingly, for example, a circuit element for which input data is stored, that is, a circuit element for which an address is "0" in a memory area is expressed as "X0". The circuit element is defined by a circuit element type indicating a type of the circuit element, the circuit element identifier for identifying the circuit element, and an instruction type.

The input unit 10 is configured using an input device such as a keyboard, a pointing device, a mouse, or a data reader, and inputs a command for editing a ladder program and a ladder program to the controller 30 under the operation of a user.

Figure 2:
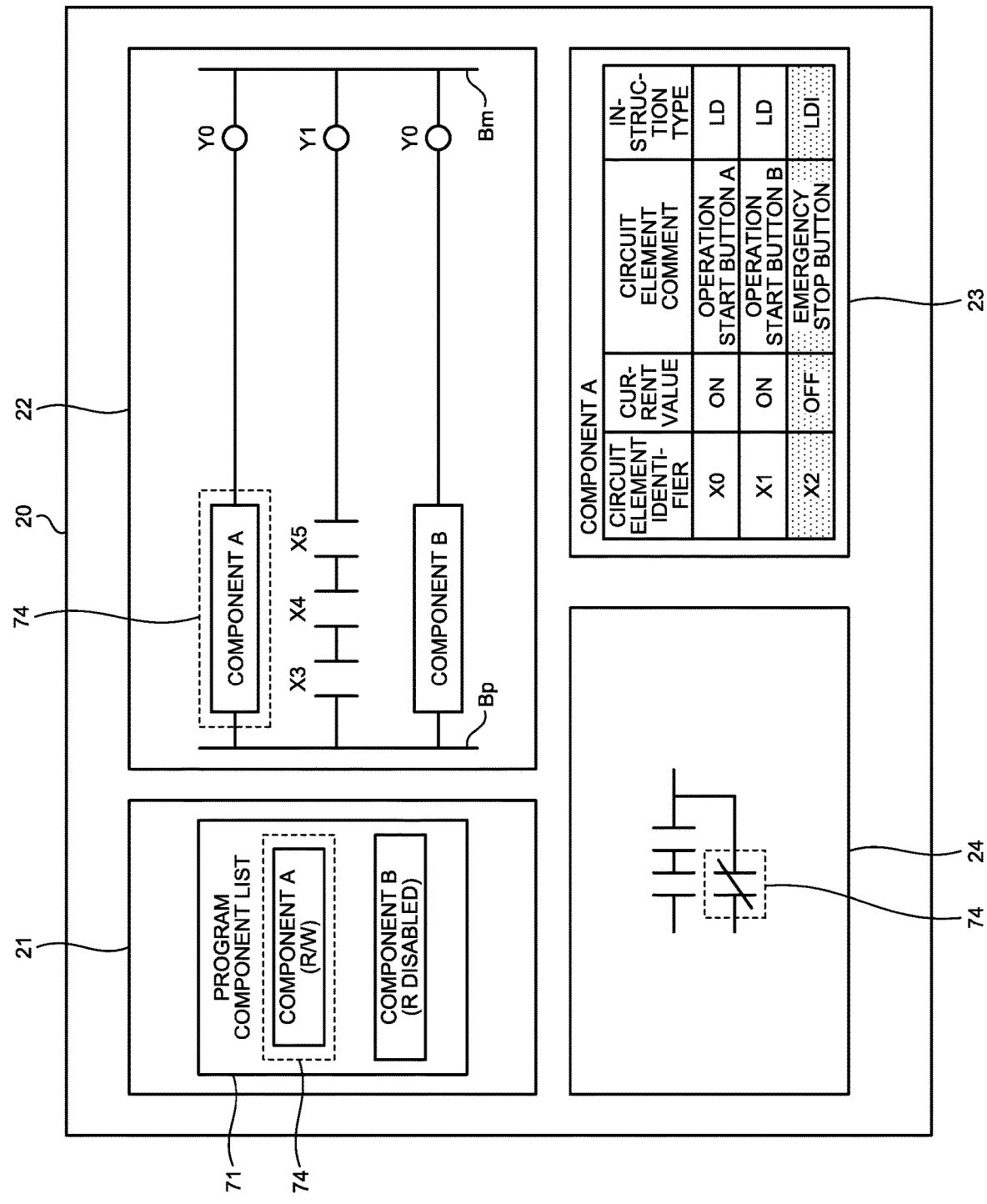
FIG. 2 is a schematic diagram illustrating an example of a screen on a display of the ladder program editing support apparatus according to the embodiment of the present invention.

The display 20 is configured using a display device such as a liquid crystal display device, and is operated under the control of the controller 30 to display screens such as a menu screen and an edit screen. FIG. 2 is a schematic diagram illustrating an example of a screen on the display 20 of the ladder program editing support apparatus 100 according to the embodiment of the present invention. The display 20 displays a screen including a program component list display region 21 that displays a program component list 71 and a program edit region 22 that displays a ladder program to edit and create the ladder program. The display 20 further displays a screen including a circuit element edit region 23 for displaying and editing symbols indicating circuit elements and constants used in a partial program defined by a program component, and a pre-componentized program display region 24 that displays a ladder program before subjected to componentization corresponding to the program component.

The controller 30 performs operation control of the ladder program editing support apparatus 100 such as operation control for editing and creating a ladder program on the screen of the display 20, operation control for storing data of the edited and created ladder program in the storage 40, and operation control for outputting the data stored in the storage 40 from the output unit 50.

In order to perform these operation controls, the controller 30 includes an input processing unit 31 that receives an instruction inputted from the input unit 10, a display control unit 32 that controls a display operation in the ladder program editing support apparatus 100, an edit control unit 33 that controls an edit operation on a ladder program, and an output control unit 34 that reads out data from the storage 40 and causes the data to be outputted from the output unit 50.

The input processing unit 31 receives various kinds of instructions inputted from the input unit 10 and distributes the instructions among the display control unit 32, the edit control unit 33, and the output control unit 34 in a sort manner based on the contents of the instructions.

The display control unit 32 controls the screen display operation for creating and displaying an image displayed on the screen of the display 20.

The edit control unit 33 controls the operation for editing and displaying a ladder program on the screen of the display 20. The edit control unit 33 has a programming function as a ladder editor, which serves as a basic function, and can produce a ladder program on the program edit region 22 of the display 20 as illustrated in FIG. 2. The edit control unit 33 can perform processing that causes the program edit region 22 on the display 20 to display a plus bus line Bp and a minus bus line Bm in the ladder program on the basis of a command from the input unit 10 and display a plurality of auxiliary lines vertically and horizontally in an area between the plus bus line Bp and the minus bus line Bm, thereby to partition the area into a plurality of cells. The edit control unit 33 can also cause the above-described screen to display an edit menu at the time of editing of the ladder program on the basis of a command from the input unit 10, and can cause a desired cell to symbolically display a desired circuit element on the basis of a command from the input unit 10. Furthermore, the edit control unit 33 generates data of a logical expression corresponding to the logical structure of an input condition and an output condition in the ladder program, and uses the data to automatically draw a connection line in the ladder program.

In order to perform these operation controls and processings, the edit control unit 33 generates coordinate information that is information by which a location of each circuit element in the ladder program can be identified, stores the coordinate information in the storage 40, and uses the coordinate information to identify the location of each circuit element and a drawing position of the connection line. The edit control unit 33 further stores data of the coordinate information or the like on an edited ladder program and data of the above-mentioned logical expression in the storage 40.

The edit control unit 33 also includes, as functional units related to generation and editing of a program component, a program component generating unit 61 that generates a program component, a program component display control unit 62 that displays a program component as one figure in the program edit region 22, and a program component circuit element editing unit 63 that edits information associated with a circuit element of a program component.

On the basis of the content of a command inputted from the input unit 10, the program component generating unit 61 generates a program component that can be reused from a part of a ladder program displayed in the program edit region 22. The program component is a partial program having the same logical structure as a circuit element making up a ladder program included in a selected range that is arbitrarily selected and subjected to editing for a program component in an existing ladder program. The program component is managed as one operation processing unit that performs the same operation processing as the operation processing in the selected range, that is, in a similar manner to that for one circuit element. The program component includes a single operation processing program which is based on one circuit element and by which a single operation is performed, or a composite operation processing program which is based on a plurality of circuit elements and by which a plurality of operations is performed.

On the basis of the content of a command inputted from the input unit 10, the program component generating unit 61 causes the program component list 71 in the storage 40 to store a ladder program included in an arbitrary designated range of a ladder program displayed in the program edit region 22 together with coordinate information. That is, the program component generating unit 61 obtains information on a circuit element from the information on the ladder program stored in the storage 40. The program component generating unit 61 then adds a program component name and security information to this information, thereby to generate and hold information on a program component, and register the information in the program component list 71. The information on a circuit element includes the coordinate information which is position information on the circuit element, property information, a circuit element comment that is a comment associated with the circuit element, and a state of the circuit element obtained from the PLC. The position information on the circuit element is information indicating the position of arrangement, on the program edit region 22, of the circuit element in the ladder program displayed in the program edit region 22 of the display 20.

The circuit element comment is a comment in which an arbitrary explanation concerning the circuit element such as the usage of the circuit element is described. A user refers to the circuit element comment to be able to easily imagine the ladder program included in the selected range. The circuit element comment therefore contributes to improvement in the efficiency of editing the ladder program.

The coordinate information is an absolute coordinate in a rectangular coordinate system in which the position in a grid area within the program edit region 22 is expressed numerically with respect to the origin (0, 0). In a case where a horizontal axis of the grid area represented as an x axis and a vertical axis of the grid area is represented as a y axis, the coordinate information is expressed by coordinates (x1, y1) obtained by a combination of a value on the x axis and a value on the y axis as the position in the grid area. The ladder program editing support apparatus 100 uses this coordinate information to display the ladder program in the program edit region 22.

The property information is information representing a property of a circuit element. The property information on a circuit element includes the circuit element type indicating a type of the circuit element, the circuit element identifier identifying the circuit element, and the instruction type.

The instruction type expresses the action of a program instruction such as start of a logical operation indicated by "LD" if the circuit element is a contact A, or a logical operation indicated by "LDI" if the circuit element is a contact B.

The program component name is a name of a program component that is uniquely defined and identifiable as a program component in the ladder program displayed in the program edit region 22. The program component name may be a name specified by the content of a command inputted from the input unit 10 or may be a name automatically given by the program component generating unit 61.

The security information is information indicating whether or not a program component obtained by componentization is a displayable component, internal information of which can be displayed on the display 20, and whether or not the program component is an editable component, the internal information of which can be edited. The displayable component is a program component, the internal information of which can be displayed on the display 20. A non-displayable component is a program component, the internal information of which cannot be displayed on the display 20. The editable component is a program component, the internal information of which can be displayed on the display 20 and can be edited. A non-editable component is a program component, the internal information of which can be displayed on the display 20 but cannot be edited. Processing of each of displaying and editing of the displayable and editable components can be protected using a password.

The program component list 71 is stored in the storage 40 and can store information on a plurality of program components. When storing information on a plurality of program components, the program component list 71 stores the information on the program components in the order of the rows corresponding to coordinate positions of leading circuit elements in the program components. That is, the program component list 71 stores the information on the program components in ascending order of the coordinate positions of the leading circuit elements in the program components. The program component list 71 also stores the information on circuit elements and the program components included in a ladder program within a selected range in the order of the rows of the ladder program and in the order of arrangement of the circuit elements in the area between the plus bus line Bp and the minus bus line Bm in one row of the ladder program, starting from the side of the plus bus line Bp. The program component list 71 also stores the program component name and security information of each program component.

On the basis of the content of a command inputted from the input unit 10, the program component display control unit 62 performs control to display a selected range selected as a range of a program component in the ladder program displayed in the program edit region 22, as one figure in the program edit region 22. That is, the program component display control unit 62 performs control to display, as one figure, a program component in the ladder program displayed in the program edit region 22. The figure displayed as the program component can be defined with an arbitrary size regardless of the size of the ladder program subjected to componentization, and a display area of the figure can be smaller than the display area of the ladder program before subjected to componentization. The program component name and an arbitrary explanation concerning the program component can be added to the figure displayed as the program component. The program component name and the arbitrary explanation concerning the program component can be displayed on the figure displayed as the program component.

The program component display control unit 62 further holds selection state information and condition satisfaction information. The program component display control unit 62 has a function of distinguishably displaying the selection state information and the condition satisfaction information on the ladder program displayed on the display 20.

The selection state information is information simply indicating whether a program component is selected or not selected. The condition satisfaction information is information representing a state of a virtual circuit element associated with a program component, and represents whether a virtual circuit element condition for a program component is satisfied or not. The virtual circuit element condition is a condition under which a program component becomes operative. The virtual circuit element is generated automatically from a single or a plurality of circuit elements in the program component, which ultimately affect the output, not from a circuit element displayed on the ladder program and held in an internal part of the program component display control unit 62. Details of the virtual circuit element condition will be described later.

On the basis of the content of a command inputted from the input unit 10, the program component circuit element editing unit 63 performs control to display, in the circuit element edit region 23, information associated with an arbitrary program component among a plurality of program components stored in the program component list 71 and edit the information. That is, the program component circuit element editing unit 63 performs control to display, in the circuit element edit region 23, information such as circuit elements and constants used in the ladder program defined as a program component and edit the information.

The program component circuit element editing unit 63 uses the information held in the program component generating unit 61 and the program component list 71 and performs control to display the circuit element identifier, the instruction type, the circuit element comment associated with a circuit element, and the state of a circuit element acquired from the PLC in the form of a list in the circuit element edit region 23 as information on each circuit element making up the program component described in the program component. The program component circuit element editing unit 63 causes the circuit element edit region 23 to display circuit elements included in the ladder program within a selected range in the form of a list according to a preset displaying order. That is, the program component circuit element editing unit 63 performs control to display the circuit elements in the order of the rows of the ladder program and in the order of arrangement of the circuit elements in the area between the plus bus line Bp and the minus bus line Bm in one row of the ladder program, starting from the side of the plus bus line Bp. The ladder program delimited by the selected range is correlated with the display in the form of a list in the circuit element edit region 23 in order for the program component circuit element editing unit 63 to cause the circuit element edit region 23 to display the circuit element identifier, the instruction type, the circuit element comment associated with a circuit element, and the state of a circuit element acquired from the PLC in the form of a list as the information on each circuit element included in the ladder program within the selected range. The information on the circuit elements in the ladder program within the selected range is displayed in the form of a list in the circuit element edit region 23, so that the arrangement and details of the circuit elements in the ladder program within the selected range can be easily understood.

Moreover, the program component circuit element editing unit 63 has a function of changing the circuit element identifier, the instruction type, or the circuit element comment of each circuit element displayed in the form of a list on the basis of the content of a command inputted from the input unit 10, storing the changed ones in the program component list 71 of the storage 40, and updating the ladder program in reflection of the ladder program stored in the storage 40. The program component circuit element editing unit 63 also has a function of causing the circuit element edit region 23 to display information about which program component the information displayed in the circuit element edit region 23 is associated with.

The program component circuit element editing unit 63 has a function of indicating, in the pre-componentized program display region 24, the position of each circuit element in the program component on the ladder program on the basis of the information on the coordinate position of the circuit element which is one of information pieces owned by the program component generating unit 61 and the program component list 71.

If display of a target program component is disabled according to the security information, the program component circuit element editing unit 63 exerts a function of disabling the display in the circuit element edit region 23 and the pre-componentized program display region 24, maintaining display in the form of one figure on the ladder program, and eliminating displaying detailed information on the program component. Moreover, if editing of a target program component is disabled according to the security information, the program component circuit element editing unit 63 exerts a function of disabling editing of the program component circuit element editing unit 63.

Note that, as described above, the information associated with a program component is displayed in the circuit element edit region 23 so that information necessary for editing the program component is provided to a user. Thus, the ladder program in the program component need not be displayed as it is in the pre-componentized program display region 24, but the logical structure of the ladder program in the program component need only be displayed in the pre-componentized program display region 24. The program component circuit element editing unit 63 thus has a function of displaying the logical structure of the ladder program in the pre-componentized program display region 24 while omitting information such as the constant and the instruction type from the display of the ladder program in the program component. The program component circuit element editing unit 63 also displays, in the pre-componentized program display region 24, the coordinate position of the ladder program displayed in an abbreviated form in the pre-componentized program display region 24. This makes it easy to recognize the position within the program component in the original ladder program.

When a command for instructing data output is inputted from the input unit 10 and distributed by the input processing unit 31 to the output control unit 34, the output control unit 34 reads out data from the storage 40, sends the data to the output unit 50, and controls the operation of the output unit 50 to cause the unit 50 to output the data.

Figure 3:
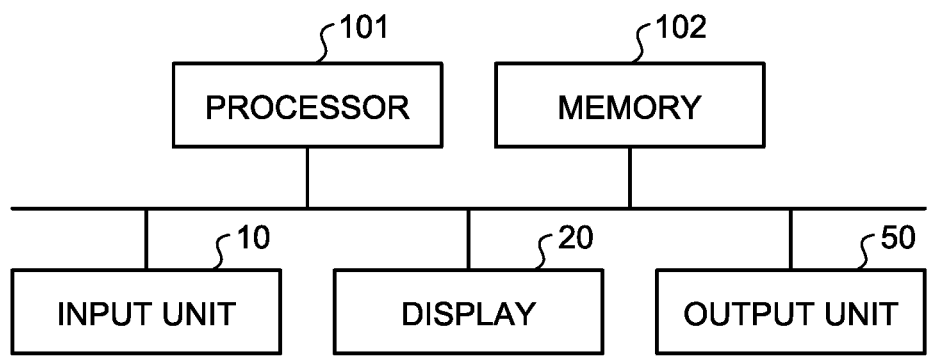
FIG. 3 is a diagram illustrating an example of the hardware configuration of a processing circuit according to the embodiment of the present invention.

FIG. 3 is a block diagram schematically illustrating an example of a hardware configuration of a computer apparatus that implements the function of the ladder program editing support apparatus 100 according to the embodiment of the present invention. The controller 30 illustrated in FIG. 1 is implemented by a processor 101 illustrated in FIG. 3 reading and executing a program stored in a memory 102, the program having the processing procedure of the controller 30 described therein. The program is recorded on a recording medium readable by the computer apparatus such as a hard disk, a compact disk (CD)-read only memory (ROM), a magneto-optical (MO) disk, or a digital versatile disk or digital video disk (DVD), or can be distributed via a network communication line such as the Internet.

The storage 40 illustrated in FIG. 1 is implemented by the memory 102 illustrated in FIG. 3. The storage 40 stores data associated with processing performed by the ladder program editing support apparatus 100 such as a control program for the controller 30, data necessary for editing of the ladder program, data generated while the ladder program is edited, and data of the ladder program edited by the edit control unit 33.

The output unit 50 is configured by a device not illustrated such as a printer, an auxiliary storage, or a transmitter connected to a network, and is operated under the control of the output control unit 34 to output data in the ladder program editing support apparatus 100 such as an already-edited ladder program.

The ladder program editing support apparatus 100 configured as described above receives a predetermined command from the input unit 10 after the apparatus is started up, displays the plus bus line Bp and the minus bus line Bm of the ladder program in the program edit region 22 on the display 20 under the operation control of the edit control unit 33, displays a plurality of auxiliary lines vertically and horizontally in an area between the plus bus line Bp and the minus bus line Bm to partition the area into a number of cells, and thereafter prompts a user to edit the ladder program.

Figure 4:
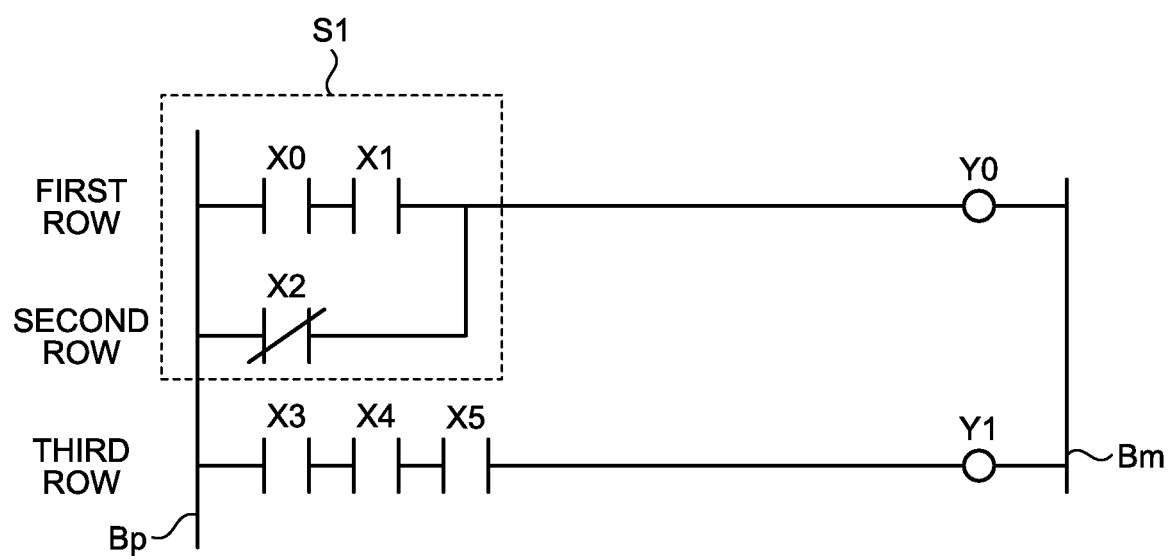
FIG. 4 is a diagram illustrating an example of a componentization source ladder program used for componentization of a ladder program in a program editing support apparatus according to the embodiment of the present invention.
Figure 5:
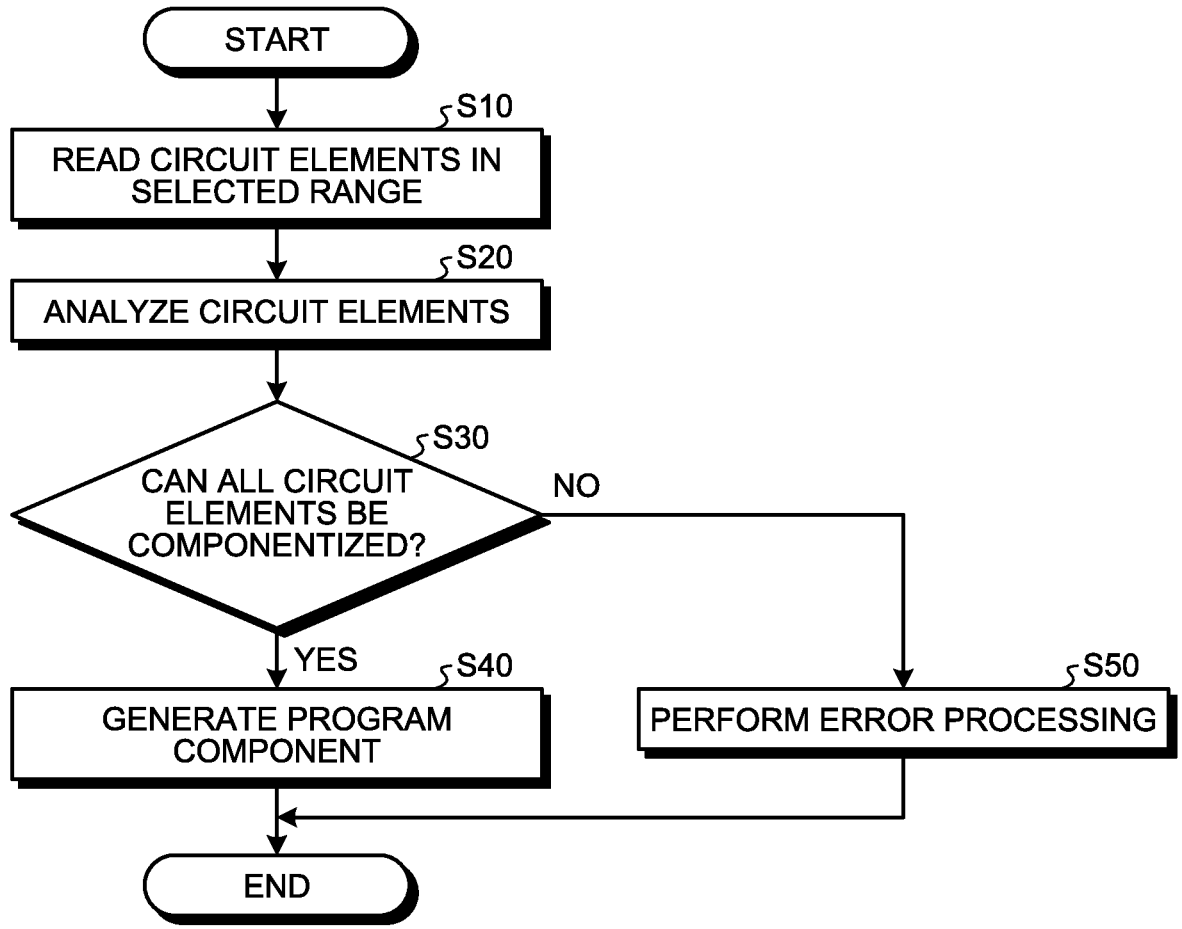
FIG. 5 is a flowchart illustrating the flow of program component generation processing executed in the ladder program editing support apparatus according to the embodiment of the present invention.

Next, a description will be given of componentization of a ladder program and a method of editing a ladder program in the ladder program editing support apparatus 100 according to the present embodiment. FIG. 4 is a diagram illustrating an example of a componentization source ladder program used for componentization of a ladder program in the ladder program editing support apparatus 100 according to the embodiment of the present invention. FIG. 5 is a flowchart illustrating the flow of program component generation processing executed in the ladder program editing support apparatus 100 according to the embodiment of the present invention. In this example, a description is given of a case where a part corresponding to a selected range S1 in the ladder program illustrated in FIG. 4 is componentized.

First, a componentization source ladder program is inputted from the input unit 10. The inputted componentization source ladder program is sent from the input unit 10 to the edit control unit 33 and displayed in the grid area of the program edit region 22 under the operation control of the edit control unit 33. The edit control unit 33 causes the storage 40 to store the componentization source ladder program.

The ladder program is displayed using symbols representing circuit elements and connection lines. In the componentization source ladder program illustrated in FIG. 4, circuit elements X0 and X1 indicating input conditions and a circuit element Y0 indicating an output condition are arranged between the plus bus line Bp and the minus bus line Bm in a first row, and these circuit elements and the plus bus line Bp and the minus bus line Bm are connected by connection lines. In addition, a circuit element X2 indicating an input condition is arranged between the plus bus line Bp and the minus bus line Bm in a second line of the ladder program and is connected to the connection line of the first row by a connection line. Moreover, circuit elements X3, X4, and X5 indicating input conditions and a circuit element Y1 indicating an output condition are arranged between the plus bus line Bp and the minus bus line Bm in a third row, and these circuit elements are connected by connection lines. Note that FIG. 4 omits illustration of the auxiliary lines.

Next, the input unit 10 inputs range selection information specifying a range subjected to componentization, the range being to be subjected to edition of a program component in the ladder program displayed in the program edit region 22. In this example, what is inputted is range selection information for selecting a part corresponding to the selected range S1 in the ladder program illustrated in FIG. 4. The inputted range selection information is sent from the input unit 10 to the program component generating unit 61.

When the range selection information is inputted, in step S10, the program component generating unit 61 reads circuit elements included in the selected range S1 that is specified by the range selection information. That is, the program component generating unit 61 performs processing of reading and storing information on the circuit elements included in the selected range S1 from the componentization source ladder program stored in the storage 40. The information on the circuit elements in this case corresponds to the position information, the circuit element comment, and the property information of the circuit elements included in the selected range S1, that is, the information on the circuit element type, the circuit element identifier, the instruction type, the circuit element comment, and the coordinate position of the circuit elements.

Figure 6:
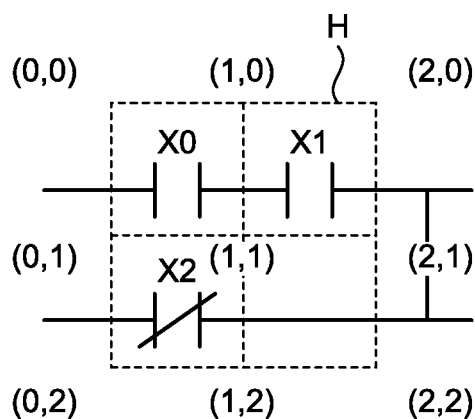
FIG. 6 is a diagram illustrating circuit elements included in a selected range selected in the ladder program editing support apparatus according to the embodiment of the present invention.

FIG. 6 is a diagram illustrating the circuit elements included in the selected range S1 selected in the ladder program editing support apparatus 100 according to the embodiment of the present invention. FIG. 6 represents auxiliary lines H around the circuit element by dotted lines, and represents the coordinate positions in the program edit region 22 in the rectangular coordinate system notation in the grid area in a manner of (0, 0), (2, 2), and so on.

Alternatively, the position information may be expressed as a relative position with respect to a specific position in the rectangular coordinate system in the grid area of the program edit region 22. The relative position is information on a position in relative coordinates determined relative to the position information on a reference circuit element. When $(\sigma, \varepsilon)$ is set as a reference point, a relative position of $(\sigma+2, \varepsilon+2)$ is $(2, 2)$, and a relative position of $(\sigma+X, \varepsilon+Y)$ is $(X, Y)$. Each of X and Y is an integer. Each of X and Y may be a numerical value indicated on a scale of the corresponding axis in the rectangular coordinate system, or may be the number of cells in the grid area.

Figure 7:
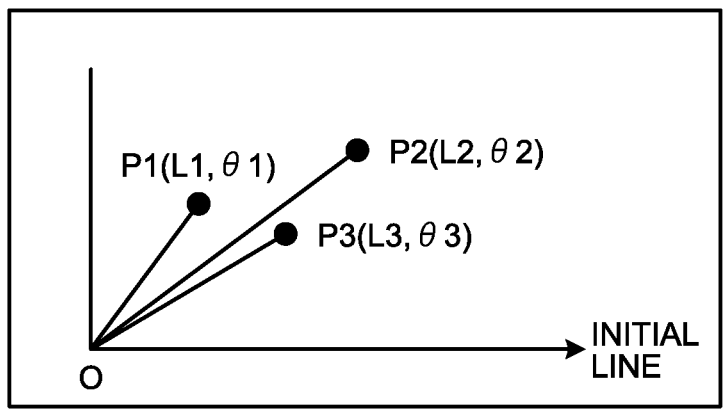
FIG. 7 is a schematic diagram illustrating an example of a method of displaying position information.

Yet alternatively, the position information may be expressed in polar coordinates. FIG. 7 is a schematic diagram illustrating an example of a method of displaying the position information. FIG. 7 illustrates a position P1, a position P2, and a position P3 in the program edit region 22 in polar coordinates. That is, the position P1 is expressed as $(L1, \theta1)$, the position P2 is expressed as $(L2, \theta2)$, and the position P3 is expressed as $(L3, \theta3)$. Each of L1, L2, and L3 is a radius vector representing the distance from the origin O. Each of $\theta1$, $\theta2$, and $\theta3$ is a deflection angle representing an angle measured counterclockwise from an initial line that is a reference half line passing through the origin.

When reading of the circuit elements is completed, in step S20, the program component generating unit 61 analyzes each of the read circuit elements. In step S30, the program component generating unit 61 analyzes whether or not all of the read circuit elements can be componentized on the basis of the property information of each of the read circuit elements and a non-componentizable condition. That is, the program component generating unit 61 analyzes the property information of each of the read circuit elements, and depending on whether or not the property information of each circuit element falls under the non-componentizable condition, the unit 61 determines whether or not the circuit element can be componentized.

The program component generating unit 61 stores in advance the non-componentizable condition that is a condition for a circuit element that cannot be componentized. The non-componentizable condition is a criterion for determining whether or not a circuit element can be componentized. The program component generating unit 61 stores, as the non-componentizable condition, information on a circuit element type of a circuit element that cannot be componentized, a circuit element identifier of a circuit element that cannot be componentized, and an instruction type of a circuit element that cannot be componentized. A circuit element whose property information does not fall under the non-componentizable condition is a circuit element that can be componentized. A circuit element whose property information falls under the non-componentizable condition is a circuit element that cannot be componentized.

In a case where all of the read circuit elements are circuit elements that can be componentized, that is, if Yes in step S30, the program component generating unit 61 performs program component generation processing in step S40 to generate a program component by componentizing the read circuit elements.

On the other hand, in a case where even one circuit element that cannot be componentized is included in the read circuit elements, that is, if No in step S30, the program component generating unit 61 performs error processing in step S50 without performing the program component generation processing, and performs control to display an error on the display 20.

Figure 8:
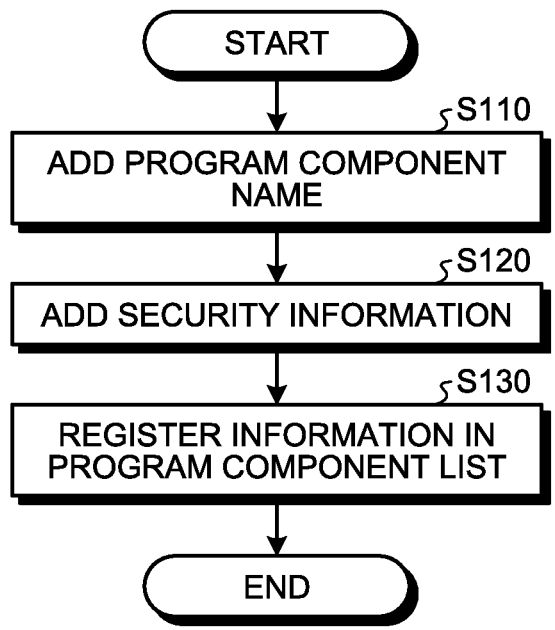
FIG. 8 is a flowchart illustrating the flow of program component generation processing executed in the program editing support apparatus according to the embodiment of the present invention.

Next, the flow of the program component generation processing will be described. FIG. 8 is a flowchart illustrating the flow of the program component generation processing executed in the ladder program editing support apparatus 100 according to the embodiment of the present invention.

In step S110, the program component generating unit 61 adds a program component name to stored information on a circuit element to be componentized. The program component name may be specified by a user or automatically provided by the program component generating unit 61 as long as the name is uniquely defined within the ladder program.

The program component generating unit 61 performs processing that causes the display 20 to display a comment for requesting input of the program component name. When a user inputs information on the program component name using the input unit 10 in response to the comment, the inputted information on the program component name is sent to the program component generating unit 61. When receiving the information on the program component name, the program component generating unit 61 adds the program component name to the stored information on the circuit element to be componentized, on the basis of the received information on the program component name. In this example, the program component name is expressed as component A.

In addition, the user can use the input unit 10 to input automatic addition instruction information for instructing automatic addition of the program component name in response to the comment. The automatic addition instruction information inputted to the input unit 10 is sent to the program component generating unit 61. When receiving the automatic addition instruction information, the program component generating unit 61 adds the program component name to the stored information on the circuit element to be componentized according to a predetermined rule.

Next, in step S120, the program component generating unit 61 adds security information to the stored information on the circuit element to be componentized.

The program component generating unit 61 performs processing that causes the display 20 to display a comment for requesting input of a password of the security information as to each of possibility of display and possibility of edit. Then, the password is inputted from the input unit 10, whereupon the inputted password is sent to the program component generating unit 61. When receiving the password, the program component generating unit 61 adds the security information and the received password to the stored information on the circuit element to be componentized. The program component to which the security information is added is managed to keep a state where the component cannot be displayed or edited unless the password is inputted.

The selected range S1 in the ladder program is componentized as described above by adding the program component name and the security information to the information on the circuit element to be componentized, which is stored in the program component generating unit 61.

Figures 9, 10:
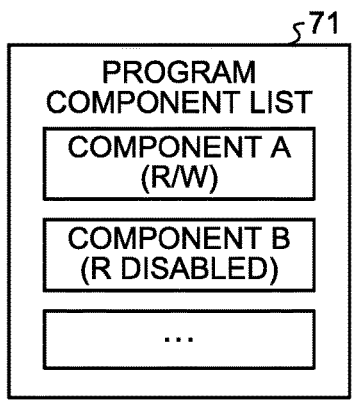
FIG. 9 is a diagram illustrating information on a program component that is stored in a list format in a program component list by a program component generating unit according to the embodiment of the present invention.
FIG. 10 is a diagram illustrating an example of the program component list in which a program component according to the embodiment of the present invention is registered.

Then in step S130, the program component generating unit 61 stores and registers the information on the componentized program component, that is, the information on the circuit element componentized to which the program component name and the security information are added, in the program component list 71 of the storage 40 in the form of files. FIG. 9 is a diagram illustrating information on a program component that is stored in the form of a list in the program component list 71 by the program component generating unit 61 according to the embodiment of the present invention. FIG. 10 is a diagram illustrating an example of the program component list 71 in which program components according to the embodiment of the present invention are registered.

As illustrated in FIG. 9, the file of each program component stores the coordinate positions and property information of circuit elements included in the program component, the circuit element comments, the program component name, and the security information. The file of each program component also stores, as a state of each circuit element, information indicating ON or OFF if the circuit element is a circuit element controlling ON and OFF of a signal, and as a current value of each circuit element, a numerical value if the circuit element is a circuit element controlling the numerical value. Security information (R/W) illustrated in the program component list 71 of FIG. 10 indicates that the component A can be displayed and can be edited. "(R disabled)" that is security information illustrated in the program component list 71 of FIG. 10 indicates that a component B cannot be displayed.

Figure 11:
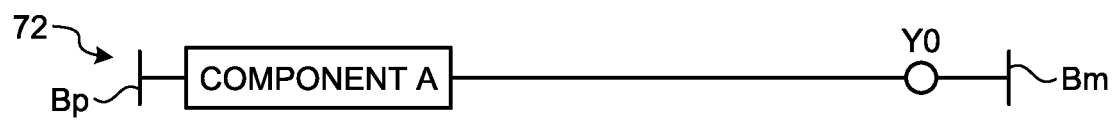
FIG. 11 is a diagram illustrating a ladder program in a state in which componentization of a selected range is completed in the embodiment of the present invention.
Figure 12:
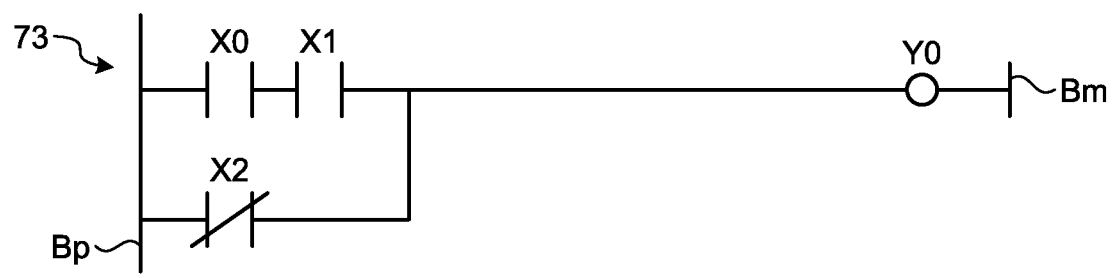
FIG. 12 is a diagram illustrating a ladder program in a state before componentization in a selected range is performed in the embodiment of the present invention.

When information on the ladder program in the selected range S1 being componentized is registered in the program component list 71, the ladder program in a state in which componentization is completed is displayed in the program edit region 22 under the control of the program component display control unit 62. FIG. 11 is a diagram illustrating a ladder program 72 in a state in which componentization of the selected range S1 is completed in the embodiment of the present invention. FIG. 12 is a diagram illustrating a ladder program 73 in a state before componentization of the selected range S1 is performed in the embodiment of the present invention.

On the screen display of the program edit region 22, the componentized part of the ladder program is expressed using a symbol having a shape of a quadrangle that is a single figure, on which the program component name is displayed. When information for selecting a componentized figure on the screen display of the program edit region 22, that is, program component selection information for selecting the program component A, is inputted from the input unit 10, the program component selection information is sent to the program component circuit element editing unit 63.

Figure 13:
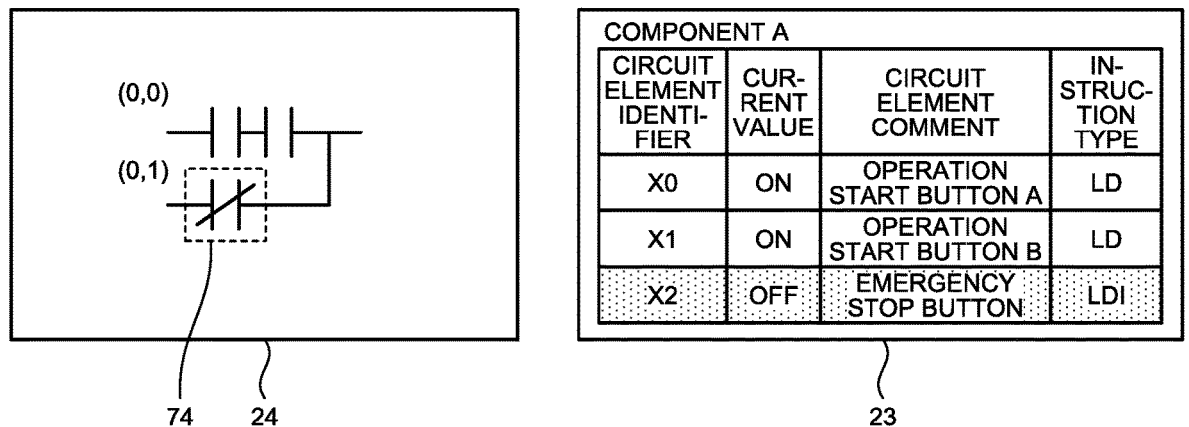
FIG. 13 is a diagram illustrating an example of a state in which information on circuit elements in a program component selected in the embodiment of the present invention is displayed in the form of a list in a circuit element edit region, and a ladder program in the selected program component is displayed in an abbreviated form in a pre-componentized program display region.

FIG. 13 is a diagram illustrating an example of a state in which information on circuit elements in the program component A selected in the embodiment of the present invention is displayed in the form of a list in the circuit element edit region 23, and a ladder program in the selected program component A is displayed in an abbreviated form in the pre-componentized program display region 24. When the program component selection information is inputted, the program component circuit element editing unit 63 causes the circuit element edit region 23 to display the information on the circuit elements in the selected program component in the form of a list as illustrated in FIG. 13, and at the same time causes the pre-componentized program display region 24 to display the ladder program in the program component A in an abbreviated form as illustrated in FIG. 13. The program component circuit element editing unit 63 further causes the pre-componentized program display region 24 to display the positions of the circuit elements in the program component A selected, that is, the circuit elements within the selected range S1, in the componentization source ladder program using the coordinate information in the rectangular coordinate system notation in the grid area. The program component circuit element editing unit 63 causes the circuit element edit region 23 to display the information on the circuit elements of the ladder program in the selected program component A in the form of a list, so that the ladder program in the selected program component A and the list format in the circuit element edit region 23 have a correlation with each other. Since the information on the circuit elements in the selected program component A is displayed in the form of a list in the circuit element edit region 23, the arrangement and details of the circuit elements in the program component A can be easily understood.

Moreover, the program component circuit element editing unit 63 highlights and displays an information piece associated with a circuit element selected to be edited in the program component among information pieces on the circuit elements in the program component displayed in the circuit element edit region 23. In FIG. 13, the information associated with the selected circuit element is displayed in color. The program component circuit element editing unit 63 also highlights and displays the position of the circuit element to be edited that is selected in the circuit element edit region 23 on the pre-componentized ladder program displayed in the abbreviated form in the pre-componentized program display region 24. In FIG. 13, the position of the circuit element to be edited that is selected in the circuit element edit region 23 is highlighted and displayed using a selection line 74.

The information on the circuit elements in the program component displayed in the circuit element edit region 23 corresponds to the circuit element identifiers, the instruction types, the circuit element comments, and the current values that represents the state of the circuit elements, of the circuit elements included in the program component. Note that the coordinate information is used to indicate the position on the ladder program of each circuit element in the program component in the pre-componentized program display region 24 and thus is not to be edited, and therefore the coordinate information is not displayed in the circuit element edit region 23. Moreover, the circuit element type corresponds to the circuit element identifier in each circuit element on a one-to-one basis, so that when the circuit element identifier is determined in a circuit element, the content of the circuit element type thereof is uniquely determined. When the circuit element identifier is edited, the program component circuit element editing unit 63 changes the circuit element type corresponding to the edited circuit element identifier in accordance with the content corresponding to the edited circuit element identifier, and cause the storage 40 to store the changed one. For this reason, the circuit element type is not displayed in the circuit element edit region 23 in order to simplify the display in the circuit element edit region 23. However, the coordinate information and the circuit element type may be displayed in the circuit element edit region 23.

Here, when display of the program component selected by the program component selection information is protected by the security information, the program component circuit element editing unit 63 performs processing that causes the display 20 to display a comment for requesting input of a password. When a password is inputted from the input unit 10, the password is sent to the program component circuit element editing unit 63. If the inputted password matches the password set for the program component, the program component circuit element editing unit 63 displays the information on the program component in the circuit element edit region 23 and the pre-componentized program display region 24. If the inputted password does not match the password set for the program component, the program component circuit element editing unit 63 does not display the information on the program component in the circuit element edit region 23 and the pre-componentized program display region 24.

Next, description is given for the flow of reusing the componentized program component A to create a program component B that has different circuit elements. A user uses the input unit 10 to input copy instruction information to the effect that the program component A is selected for copy. The inputted copy instruction information is sent from the input unit 10 to the program component circuit element editing unit 63. The program component circuit element editing unit 63 copies the program component A displayed in the program edit region 22 on the basis of the copy instruction information, and causes the storage 40 to store a copied program component having exactly the same configuration as the program component A.

Next, the user uses the input unit 10 to input paste instruction information to the effect that the copied program component should be pasted in the ladder program indicated in the program edit region 22 after selecting a paste location therefor. The inputted paste instruction information is sent from the input unit 10 to the program component circuit element editing unit 63. The program component circuit element editing unit 63 pastes the copied program component to a designated portion in the ladder program displayed in the program edit region 22 on the basis of the paste instruction information.

As a result, the copied program component is also displayed in the program edit region 22 as with the program component A. The copy and paste processing is performed by using a ladder editor function owned by the edit control unit 33 in the ladder program editing support apparatus 100. Then, the ladder program in which the copied program component is pasted is stored again in the storage 40. This processing is similar to the processing of copying and pasting each circuit element in the ladder program.

After the processing of pasting the copied program component is performed, the program component circuit element editing unit 63 performs processing that causes the display to display a comment for requesting input of the program component name. The component name of the copied program component may be specified by a user or automatically provided by a program editor as long as the name is uniquely defined within the ladder program. The provision of the component name of the copied program component is performed similarly to that in step S110 described above. As a result, the program component name of the copied program component stored in the storage 40 is replaced with the provided program component name.

Figure 14:
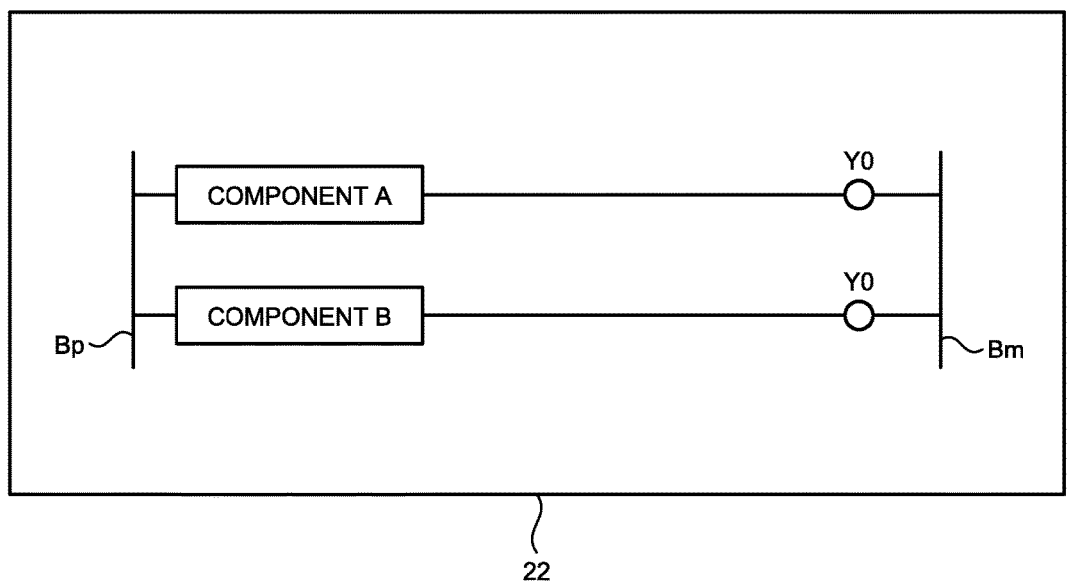
FIG. 14 is a diagram illustrating an example of screen display of a program edit region in a state in which arrangement of program components in a ladder program is completed in the embodiment of the present invention.

FIG. 14 is a diagram illustrating an example of screen display of the program edit region 22 in a state in which arrangement of the program component B in the ladder program is completed in the embodiment of the present invention. In this example, the program component name of the copied program component is defined as the component B. Thus, as illustrated in FIG. 14, the program component B expressed by one quadrangular symbol is displayed in the program edit region 22 as with the program component A. Also in this case, the program edit region 22 displays the program component B just in a manner using one quadrangular symbol with the program component name of "component B" written on the symbol.

Figure 15:
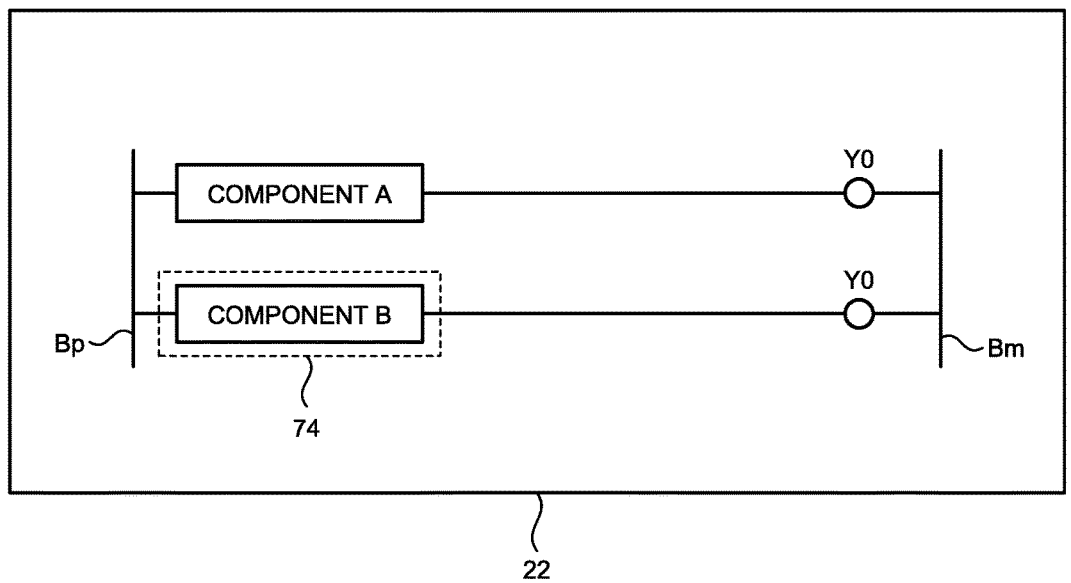
FIG. 15 is a diagram illustrating an example of screen display of the program edit region in a state in which a program component is selected in the embodiment of the present invention.

FIG. 15 is a diagram illustrating an example of screen display of the program edit region 22 in a state in which the program component B is selected in the embodiment of the present invention. When program component selection information for selecting the program component B in the screen display of the program edit region 22 is inputted from the input unit 10 and sent to the program component circuit element editing unit 63, the program component circuit element editing unit 63 highlights the currently selected program component B using the selection line 74 on the ladder program displayed in the program edit region 22.

Moreover, as is the case with the program component A being selected, the program component circuit element editing unit 63 performs control to display information on circuit elements in the program component B in the circuit element edit region 23 in the form of a list, and at the same time display the ladder program in the program component B in an abbreviated form in the pre-componentized program display region 24.

Then, the program component circuit element editing unit 63 can edit the circuit element identifiers, the current values, the circuit element comments, and the instruction types, which are the information on the circuit elements in the program component B displayed in the form of a list in the circuit element edit region 23. That is, the program component circuit element editing unit 63 can change the above information in the circuit element edit region 23 and store the changed information in the storage 40. Changing the above information can create the program component B that is different from the program component A in constituent elements. On the basis of the content of a command inputted from the input unit 10, the program component circuit element editing unit 63 can change the information on the circuit elements in the program component B displayed in the circuit element edit region 23 and update the ladder program stored in the storage 40 to a state in which the program component B is inserted therein.

Figure 16:
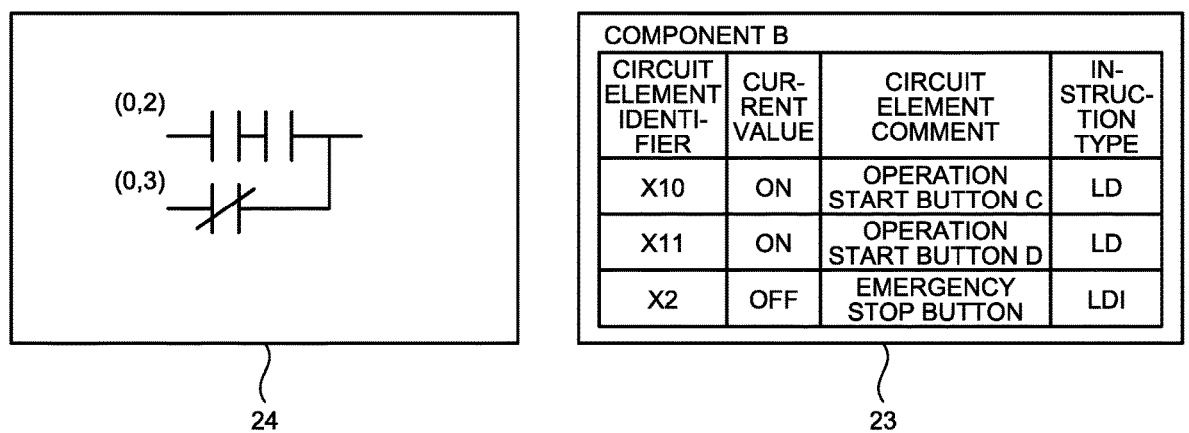
FIG. 16 is a diagram illustrating an example of screen display of the circuit element edit region and the pre-componentized program display region in a state in which creation of a program component is completed in the embodiment of the present invention.

FIG. 16 is a diagram illustrating an example of screen display of the circuit element edit region 23 and the pre-componentized program display region 24 in a state in which creation of the program component B is completed in the embodiment of the present invention. A change in the information on the circuit elements in the program component B is reflected in the ladder program of the program component stored in the storage 40 so that the ladder program is updated. That is, a circuit element on the ladder program stored in the storage 40 is changed with the content of the change made in the circuit element edit region 23, and so the changed ladder program is stored again in the storage 40.

Next, a description will be given of a case where an operation check of the ladder program is performed with a part of the latter program being componentized. In a method of checking the operation using an external PLC, the ladder program with a part thereof being componentized is stored in a memory of the PLC, and then the controlled object device is operated under the control of the PLC to check whether or not the controlled object device operates normally as designed, using an operation check function in the edit control unit 33 on the basis of information inputted from the PLC.

The operating state of the program component is checked on the basis of information in the program component display control unit 62. The program component display control unit 62 has the selection state information and condition satisfaction information on a program component basis. The program component display control unit 62 can display information on whether or not the condition is satisfied as indicated by the condition satisfaction information on the ladder program displayed in the program edit region 22 at the time of checking the operation of the program. As a result, the operation of the ladder program can be checked without displaying the detailed configuration within the program component on the display 20 but with hiding the configuration.

The condition establishment information is the information representing whether a virtual circuit element condition included in the program component is satisfied or not. The virtual circuit element condition is automatically generated using the information in the program component list 71 in the program component display control unit 62 and held in inside thereof. The virtual circuit element condition is generated on the basis of, not a circuit element displayed on the ladder program, a single or a plurality of circuit elements that ultimately affect the output from the program component, from among the program components defined as described above.

Figure 17:
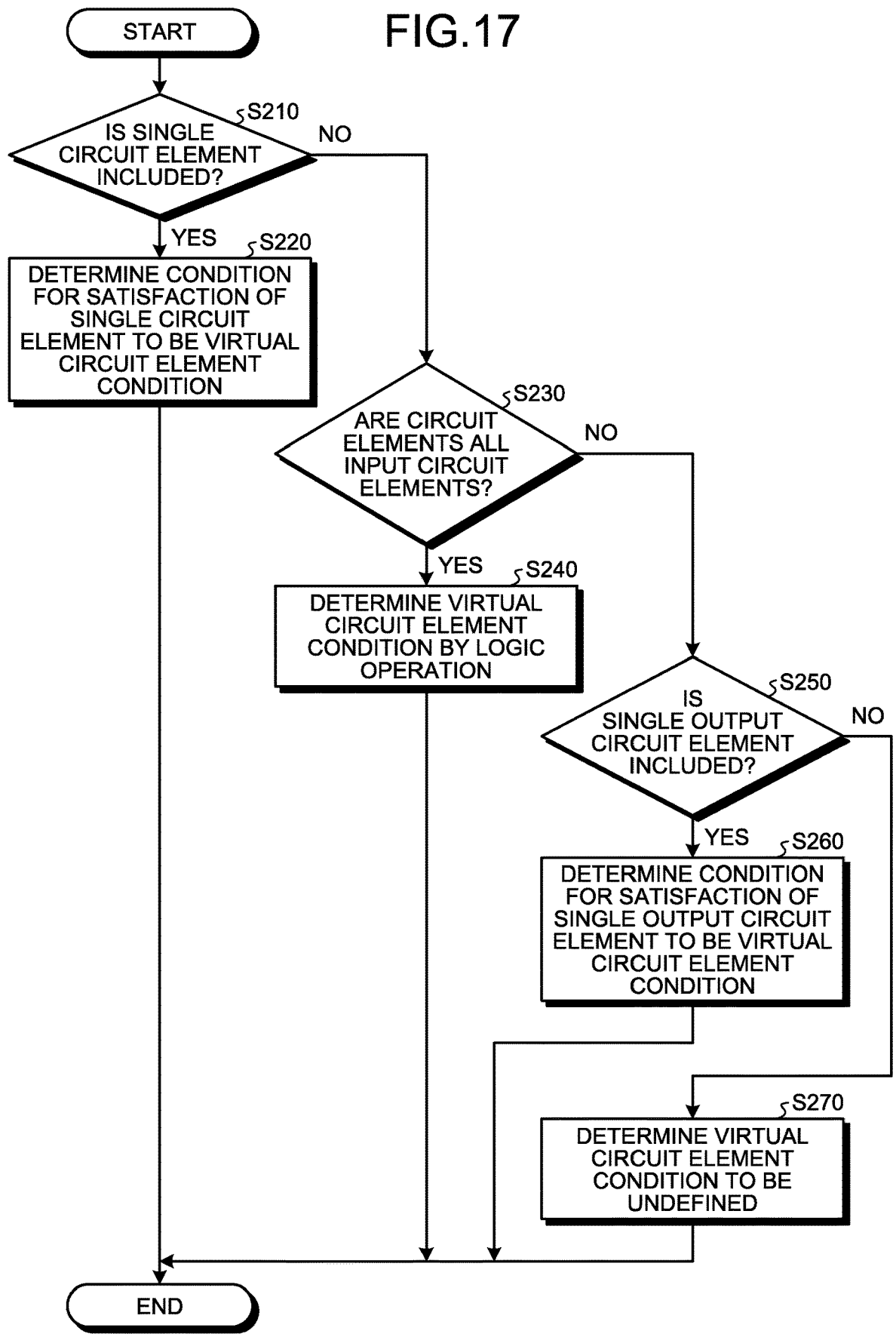
FIG. 17 is a flowchart illustrating the flow of processing that determines a virtual circuit element condition in the ladder program editing support apparatus according to the embodiment of the present invention.

Here, a method of determining the virtual circuit element condition is described. FIG. 17 is a flowchart illustrating the flow of processing that determines the virtual circuit element condition in the ladder program editing support apparatus 100 according to the embodiment of the present invention.

First, in step S210, the program component display control unit 62 determines whether or not a program component includes a single circuit element on the basis of the information on the program component registered in the program component list 71 stored in the storage 40. If it is determined that the program component includes a single circuit element, that is, if Yes in step S210, the program component display control unit 62 in step S220 sets a condition for satisfaction of the single circuit element included in the program component as the virtual circuit element condition as is.

On the other hand, if it is determined that the program component includes a plurality of circuit elements, that is, if No in step S210, the program component display control unit 62 in step S230 determines whether or not the circuit elements included in the program component are all input circuit elements that are to be situated for an input stage. That is, the program component display control unit 62 checks whether the circuit elements in the program component includes an output circuit element that is to be situated for an output stage, such as a coil.

If it is determined that the circuit elements included in the program component are all input circuit elements, that is, if Yes in step S230, the program component display control unit 62 in step S240 performs a logic operation to thereby determine the virtual circuit element condition. Here, description is given for a case where the program component includes two input circuit elements α and β, as an example of the case where the program component includes a plurality of input circuit elements.

Considering the relationship between the two input circuit elements α and β, there are two cases, that is, a case where output is made from the program component with α and β, being satisfied, and a case where output is made from the program component with α or β, being satisfied. The case where output is made from the program component with α and β, being satisfied is denoted by (α and β). The case where output is made from the program component with α or β, being satisfied is denoted by (α or β). Moreover, Z represents the virtual circuit element condition for the program component. In the case of (α and β), Z is a logical AND of α and β. In the case of (α or β), Z is a logical OR of α and β.

In a case where three or more input circuit elements are included in the program component, a result of the logical operation of two input circuit elements may be regarded as a single input circuit element W. Hereby, the relationship among the two or more input circuit elements included in the program component ultimately results in two cases similar to the case of (α and β) where output is made from the program component with α and β being satisfied and the other case of (α or β) where output is made from the program component with α or β being satisfied, as described above. The case can thus be considered similarly to the above-mentioned case where the two input circuit elements of α and β are included in the program component.

If it is determined that the circuit elements included in the program component are not all input circuit elements, that is, if No in step S230, the program component display control unit 62 in step S250 determines whether or not the program component includes a single output circuit element.

If it is determined that the program component includes a single output circuit element, that is, if Yes in step S250, the program component display control unit 62 in step S260 sets a condition for satisfaction of the single output circuit element included in the program component as the virtual circuit element condition as is.

The virtual circuit element condition cannot be uniquely defined if it is determined that two or more output circuit elements are included in the program component, that is, if No in step S250. Thus, in step S270, the program component display control unit 62 determines the virtual circuit element condition to be undefined and does not determine the virtual circuit element condition. In this case, one cannot check whether the condition is satisfied or not on a component basis at the time of checking the operation of the program.

By the method described above, the virtual circuit element condition is determined in the program component display control unit 62 so that whether the virtual circuit element condition is satisfied or not can be displayed at the time of checking the operation of the ladder program. The ladder program editing support apparatus 100 can then check the operation of the ladder program on a component basis while the program remains componentized. Consequently, readability of the ladder program is improved, and it is possible to identify a relative position of the copied program component on the program at a glance even at the time of the operation check. This facilitates the operation check and debugging of the program and improves work efficiency of editing the program.

Figure 18:
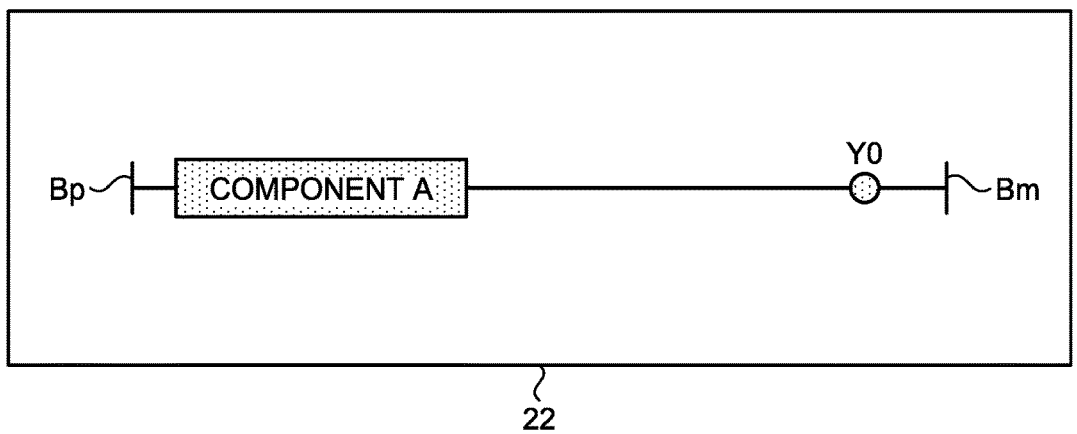
FIG. 18 is a diagram illustrating an example of screen display of the program edit region in a state in which the condition for the circuit element of a program component is satisfied in checking the operation of a ladder program written in a PLC with the program component being componentized in the embodiment of the present invention.
Figure 19:
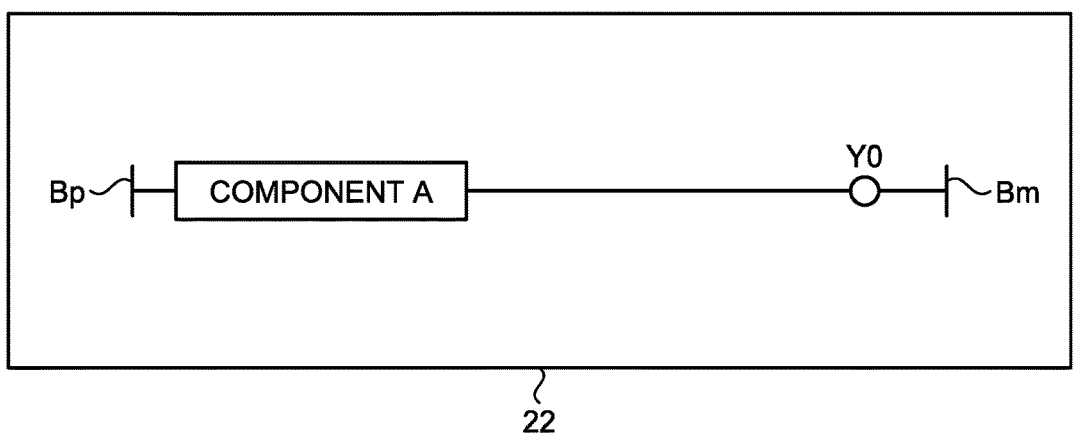
FIG. 19 is a diagram illustrating an example of screen display of the program edit region in a state in which the condition for the circuit element of a program component is not satisfied in checking the operation of a ladder program written in a PLC with the program component being componentized in the embodiment of the present invention.

FIG. 18 is a diagram illustrating an example of screen display of the program edit region 22 in a state in which the condition for the circuit element of the program component A is satisfied in checking the operation of a ladder program written in a PLC with the program component A being componentized in the embodiment of the present invention. FIG. 19 is a diagram illustrating an example of screen display of the program edit region 22 in a state in which the condition for the circuit element of the program component A is not satisfied in checking the operation of the ladder program written in the PLC with the program component A being componentized in the embodiment of the present invention. In the state in which the condition for the circuit element of the program component A is satisfied, as illustrated in FIG. 18, the program component A and a circuit element Y0 are colored on the ladder program displayed in the program edit region 22, thereby displaying that the operating state of the program component A is ON. In the state in which the condition for the circuit element of the program component A is not satisfied, as illustrated in FIG. 19, the program component A and the circuit element Y0 are not colored on the ladder program displayed in the program edit region 22, thereby displaying that the operating state of the program component A is OFF.

Figure 20:
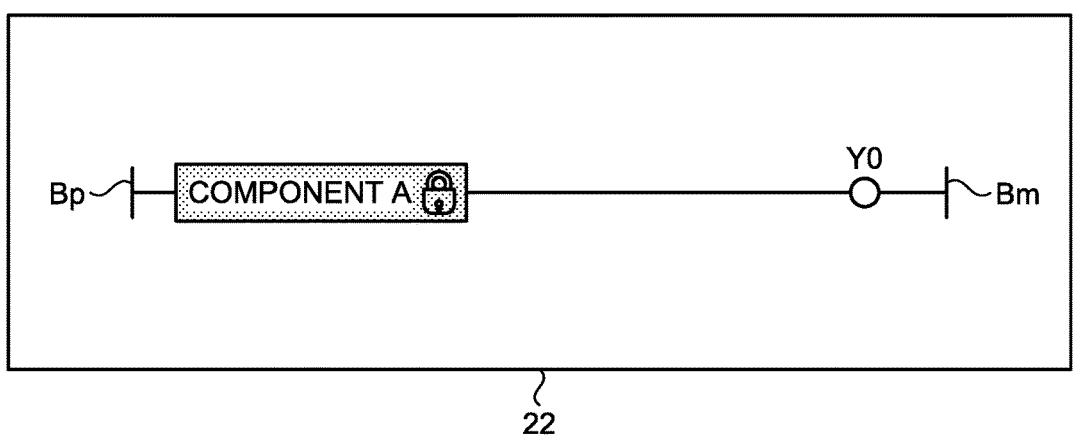
FIG. 20 is a diagram illustrating an example of screen display of the program edit region in a state in which reading of information on a program component is disabled according to security information in the embodiment of the present invention.

FIG. 20 is a diagram illustrating an example of screen display of the program edit region 22 in a state in which reading of information on the program component A is disabled according to security information in the embodiment of the present invention. FIG. 21 is a diagram illustrating an example of screen display of the circuit element edit region 23 and the pre-componentized program display region 24 in the state in which reading of information on the program component A is disabled according to the security information in the embodiment of the present invention. In FIG. 20, a lock mark is displayed on the symbol of the program component A and at the same time the symbol is colored for display. In FIG. 21, in each of the circuit element edit region 23 and the pre-componentized program display region 24, there is displayed a message to the effect that the program in the program component cannot be read because reading thereof is disabled.

The security information of the program component is retained in the program component list 71, so that reading and editing of the program in the program component can be disabled/prohibited on the ladder program editing support apparatus 100 according to the security information. Then, the program edit region 22, the circuit element edit region 23, and the pre-componentized program display region 24 display on the screens that reading of the information on the program component A is disabled.

Note that the function of the display control unit 32 may be performed by the edit control unit 33. Moreover, the non-componentizable condition may be retained in a part other than the program component generating unit 61 in the ladder program editing support apparatus 100. Furthermore, the addition of the security information in step S120 of FIG. 8 can be omitted at the time of generating the program component, and can be defined later. The information stored in the program component list 71 and displayed and the information displayed in the circuit element edit region 23 and edited are not limited to those described above.

Although the foregoing description has been given of the ladder program editing support apparatus 100, the ladder program editing support apparatus 100 basically need only have the function of displaying circuit elements included in a ladder program as figures at desired coordinates on the screen of the ladder program editing support apparatus to create data of a logical expression corresponding to the logical structure in the ladder program on the basis of the arrangement of the circuit elements, and identifying circuit elements to be connected in parallel to each other in the ladder program on the basis of the data of the logical expression to connect output ends of the circuit elements using connection lines. Therefore, the ladder program editing support apparatus 100 according to the present embodiment can have various transformations, modifications, combinations, and the like besides the above embodiment.

In a case where composite processing describing the same operation needs to be described at two or more places in the process of creating a ladder program indicating a control operation on a controlled object, the ladder program editing support apparatus 100 according to the present embodiment can select the composite processing describing the same operation and indicate it using one figure as one program component in the program edit region 22.

When the program component indicated as one figure on the ladder program is selected in the program edit region 22, circuit elements in the program component can be displayed in the form of a list in the circuit element edit region 23, and a pre-componentized ladder program corresponding to the program component can be displayed in an abbreviated form in the pre-componentized program display region 24. When the circuit element displayed in the circuit element edit region 23 is selected, the position of the selected circuit element on the pre-componentized ladder program can be displayed in the pre-componentized program display region 24. As a result, it is possible to easily check and understand the configuration in the program component while comparing it with the pre-componentized ladder program in the display 20.

The ladder program editing support apparatus 100 selects and copies a program component on the ladder program displayed in the program edit region 22 and paste the copied program component to a different location on the ladder program, thereby making it possible to create a ladder program having elements similar to the elements in the program component. Then, the copied program component is distinguished as a different program component from the original program component from which the copy is made.

When the copied program component is selected in the program edit region 22, the ladder program editing support apparatus 100 can display a list of information on circuit elements in the program component in the form of a list in the circuit element edit region 23 and display a pre-componentized ladder program corresponding to the program component in an abbreviated form in the pre-componentized program display region 24. Then, a change in the information on the circuit elements on the list of the information on the circuit elements displayed in the circuit element edit region 23 is reflected in the ladder program of the program component, thereby changing a circuit element in the program. By doing so, it is possible to easily set a condition for the different program component while comparing and checking the configuration in the program component with the pre-componentized ladder program in the display 20.

Here, the display format of the information on the circuit elements in the circuit element edit region 23 will be described. FIG. 22 is a diagram illustrating an example of a state in which the information on the circuit elements in the program component A selected in the embodiment of the present invention is displayed in the form of a list in another display pattern in the circuit element edit region 23. In FIG. 22, the information on the circuit elements in the program component A, that is, identification information on the circuit elements included in the ladder program within the selected range S1, is displayed in the form of a list in the circuit element edit region 23 in the order of the rows of the ladder program and the order of arrangement of the circuit elements in the area between the plus bus line and the minus bus line of one line of the ladder program. That is, in FIG. 22, the information on the circuit elements is displayed in the form of a list according to the configuration of the ladder program.

FIG. 23 is a diagram illustrating a ladder program 75 in a state before componentization of a selected range S2 is performed in the embodiment of the present invention. FIG. 24 is a diagram illustrating a ladder program 76 in a state in which componentization of the selected range S2 is completed in the embodiment of the present invention. A program component C is arranged in the ladder program 76 illustrated in FIG. 24, the program component C being obtained by componentizing the selected range S2 illustrated in FIG. 23 in the ladder program editing support apparatus 100. Here, the component name of the program component C is defined as component C.

FIG. 25 is a diagram illustrating an example of a state in which the information on the circuit elements in the program component C selected in the embodiment of the present invention is displayed in the form of a list in another display pattern in the circuit element edit region 23. In FIG. 25, the information on the circuit elements in the program component C, that is, identification information on the circuit elements included in the ladder program within the selected range S2, is displayed in the form of a list in the circuit element edit region 23 in the order of the rows of the ladder program and the order of arrangement of the circuit elements in the area between the plus bus line and the minus bus line in one row of the ladder program while circuit elements indicating an input condition and a circuit element indicating an output condition are separated in left and right regions of the circuit element edit region 23, respectively.

When checking the operation of the ladder program, the ladder program editing support apparatus 100 can indicate a state of the virtual circuit element, which is a condition for a program component to be operative when the program component is equally regarded as one circuit element, on the ladder program in the program edit region 22, thereby making it possible to provide an environment in which one can easily understand the operating state of the program component.

In a case where composite processing in which the same operation is described is written at a plurality of places, the ladder program editing support apparatus 100 performing the above processing can paste a copied program component to an arbitrary location in the ladder program, and can easily change some of the elements of the selected program of the program component. This can provide an environment in which the ladder program can be easily changed, prevent misediting of the ladder program, and allow one to check the operation of the ladder program while hiding details of the program.

When a versatile program component that can be reused in a plurality of systems is created using function blocks, a ladder circuit unnecessary for implementing some system is included in the component so that reuse is often difficult when using a single component. For this reason, a plurality of function blocks has to be separately created, the function blocks having variations obtained based on an original component, or other function blocks have to be created, the function blocks being obtained by cutting out a part other than the unnecessary ladder circuit as a smaller unit component. In this case, a large amount of work associated with recreating the function block and editing the program, which is performed manually by a user, is required, by which misediting may be caused.

Moreover, in creating a function block, a circuit element included in a program subjected to componentization needs to be defined as a variable, and the program has to be created using the variable. A user needs to manually define the variable by using a ladder program described with the circuit element as input so as to create a ladder program. This work takes many man-hours and possibly causes misediting.

When a ladder program is generated from information in a reference table without using a function block, a correction and an addition of a ladder program are performed manually on the ladder program, thereby causing a large amount of work and possible misediting.

On the other hand, as compared to the method using the function blocks, the ladder program editing support apparatus 100 according to the present embodiment does not require the creation of a variable necessary for creating a function block and the operation of linking the variable to a circuit element actually used, thereby making it possible to easily componentize an arbitrary range of an existing ladder program for reuse. As a result, the ladder program editing support apparatus 100 can reduce the load on an operator in program editing and improve work efficiency.

The ladder program editing support apparatus 100 can also check the operation of the program on a component basis while the program is componentized, thereby improving readability of the ladder program and work efficiency in program editing.

Moreover, the ladder program editing support apparatus 100 can restrict editing and display of the ladder program in the program component using the security information added to the program component. This can prevent misediting of the program component and allow one to check the operation of the ladder program while hiding details of the program.

As described above, the ladder program editing support apparatus 100 according to the present embodiment can easily componentize and reuse an arbitrary range of the ladder program, thereby providing a ladder program editing support apparatus that allows a high degree of freedom of editing and can improve the efficiency of editing the ladder program.

Furthermore, the functions of the ladder program editing support apparatus 100 described above may be applied to a program editing support apparatus that supports creation of a program in graphic language. The graphic language is a programming language in which a program is written using visual objects, not described in text.

The configuration illustrated in the above embodiment merely illustrates an example of the content of the present invention, and can thus be combined with other publicly known techniques or partially omitted and/or modified without departing from the scope of the present invention.

REFERENCE SIGNS LIST 10 input unit; 20 display; 21 program component list display region; 22 program edit region; 23 circuit element edit region; 24 pre-componentized program display region; 30 controller; 31 input processing unit; 32 display control unit; 33 edit control unit; 34 output control unit; 40 storage; 50 output unit; 61 program component generating unit; 62 program component display control unit; 63 program component circuit element editing unit; 71 program component list; 72, 76 ladder program in a state where componentization is completed; 73, 75 ladder program in a state before componentization is performed; 74 selection line; 100 ladder program editing support apparatus; 101 processor; 102 memory; A, B, C program component; Bm minus bus line; Bp plus bus line; H auxiliary line; W input circuit element; X0, X1, X2, X3, X4, X5, Y0, Y1 circuit element.

The invention claimed is:

1. A ladder program editing support apparatus for editing a ladder program by causing a display to display a plurality of circuit elements that is each displayed as a symbol in an area between a plus bus line and a minus bus line in the ladder program and makes up the ladder program, the apparatus comprising:
the display to display the ladder program; and
edit control circuitry to display identification information on the circuit elements included in the ladder program within a selected range to be edited within the ladder program displayed on the display on the display in the form of a list according to a preset displaying order.

2. A ladder program editing support apparatus for editing a ladder program described over a plurality of rows by causing a display to display a plus bus line and a minus bus line in the ladder program and a plurality of circuit elements that is each displayed as a symbol in an area between the plus bus line and the minus bus line and makes up the ladder program, the apparatus comprising:
the display to display the ladder program;
an edit control circuitry to select a selected range to be edited within the ladder program displayed on the display; and
a memory to store the ladder program within the selected range together with position information that specifies positions on the display of the circuit elements included in the ladder program within the selected range.

3. The ladder program editing support apparatus according to claim 1, wherein
the edit control circuitry causes the display to display the identification information on the circuit elements included in the ladder program within the selected range in the form of a list according to the order of arrangement in the area between the plus bus line and the minus bus line in one row of the ladder program.

4. The ladder program editing support apparatus according to claim 1, wherein
the edit control circuitry causes the display to display the identification information on the circuit elements included in the ladder program within the selected range in the form of a list according to the order of rows of the ladder program and the order of arrangement in the area between the plus bus line and the minus bus line in one row of the ladder program.

5. The ladder program editing support apparatus according to claim 1, wherein
the edit control circuitry causes the display to display a comment associated with each of the circuit elements.

6. The ladder program editing support apparatus according to claim 5, wherein
the edit control circuitry can edit the identification information and the comment on the circuit element displayed on the display.

7. The ladder program editing support apparatus according to claim 1, wherein
the edit control circuitry causes the display to display a current value indicating a current state of each of the circuit elements, and changes the current value.

8. The ladder program editing support apparatus according to claim 1, wherein
the edit control circuitry causes the display to symbolically display the circuit element included in the ladder program within the selected range and causes the display to display the position of the circuit element in the ladder program along with the displayed circuit element.

9. The ladder program editing support apparatus according to claim 1, wherein
the edit control circuitry causes the display to display, on the ladder program, the ladder program included in the selected range using a single figure.

10. The ladder program editing support apparatus according to claim 1, wherein
the edit control circuitry causes the display to display information on an operating state of the ladder program, which is defined by the ladder program within the selected range and is inputted from the outside when the operation of the ladder program within the selected range is checked.

11. The ladder program editing support apparatus according to claim 1, wherein
the edit control circuitry adds, to the ladder program included in the selected range, security information that restricts displaying of the ladder program included in the selected range on the display and editing of the ladder program included in the selected range.

12. The ladder program editing support apparatus according to claim 1, wherein
the edit control circuitry copies the ladder program within the selected range and arranges the copy as one program component at an arbitrary position in the ladder program.

13. The ladder program editing support apparatus according to claim 2, wherein
the edit control nit circuitry causes the display to display identification information on the circuit elements included in the ladder program within the selected range in the form of a list according to a preset displaying order.

14. The ladder program editing support apparatus according to claim 1, wherein
the edit control circuitry causes the display to display the identification information on the circuit elements included in the ladder program within the selected range in the form of a list according to the order of rows of the ladder program.

15. A ladder program editing method in a ladder program editing support apparatus that edits a ladder program by causing a display to display identification information on a plurality of circuit elements that is each displayed as a symbol in an area between a plus bus line and a minus bus line in the ladder program and makes up the ladder program, the method comprising:
a first step of displaying the ladder program on the display;
a second step of causing the display to display the identification information on the circuit elements included in the ladder program within a selected range to be edited within the ladder program displayed on the display in the form of a list according to a preset displaying order.

16. The ladder program editing method according to claim 15, further comprising:
a step of displaying the identification information on the circuit elements included in the ladder program within the selected range on the display in the form of a list according to the order of rows of the ladder program.

17. The ladder program editing method according to claim 15, further comprising:
a step of displaying the identification information on the circuit elements included in the ladder program within the selected range on the display in the form of a list according to the order of arrangement in the area between the plus bus line and the minus bus line in one row of the ladder program.

18. The ladder program editing method according to claim 15, further comprising:
a step of displaying the identification information on the circuit elements included in the ladder program within the selected range on the display in the form of a list according to the order of rows of the ladder program and the order of arrangement in the area between the plus bus line and the minus bus line in one row of the ladder program.

19. The ladder program editing method according to claim 15, comprising
a step of causing the memory to store a comment associated with each of the circuit elements and causing the display to display the comment.

20. The ladder program editing method according to claim 19, comprising
a step of changing the identification information and the comment on the circuit element displayed on the display, and causing the memory to store the change.

21. The ladder program editing method according to claim 15, comprising
a step of causing the display to display a current value that indicates a current state of each of the circuit elements, and changing the current value.

22. The ladder program editing method according to claim 15, comprising
a step of causing the display to symbolically display the circuit elements included in the ladder program within the selected range and causing the display to display the position of the circuit element in the ladder program along with the displayed circuit element.

23. The ladder program editing method according to claim 15, comprising
a step of causing the display to display, on the ladder program, the ladder program included in the selected range using a single figure.

24. The ladder program editing method according to claim 15, comprising
a step of causing the display to display information on an operating state of the ladder program which is defined by the ladder program within the selected range and is inputted from the outside when the operation of the ladder program within the selected range is checked.

25. The ladder program editing method according to claim 15, comprising
a step of adding, to the ladder program included in the selected range, security information that restricts displaying of the ladder program included in the selected range on the display and editing of the ladder program included in the selected range.

26. The ladder program editing method according to claim 15, comprising
a step of copying the ladder program within the selected range and arranging the copy as one program component at an arbitrary position in the ladder program.

27. A ladder program editing method in a ladder program editing support apparatus that edits a ladder program described over two or more rows by causing a display to display a plus bus line and a minus bus line and a plurality of circuit elements that is each displayed as a symbol in an area between the plus bus line and the minus bus line and makes up the ladder program, the method comprising:
a first step of displaying the ladder program on the display;
a second step of storing, in a memory, the ladder program within a selected range to be edited within the ladder program displayed on the display together with position information that specifies coordinate positions on the display of the circuit elements included in the ladder program within the selected range.

28. The ladder program editing method according to claim 27, comprising
a step of causing the display to display identification information on the circuit elements included in the ladder program within the selected range in the form of a list according to a preset displaying order.

* * * * *